(12) United States Patent
Kuo et al.

(10) Patent No.: US 7,737,414 B2
(45) Date of Patent: Jun. 15, 2010

(54) ATOMICALLY SHARP IRIDIUM TIP

(75) Inventors: Hong-Shi Kuo, Taiwan (TW); Ing-Shouh Hwang, Taipei (TW); Tien T. Tsong, Kirkland, WA (US); Tsu-Yi Fu, Taipei (TW)

(73) Assignee: Academia Sinica, Taipei (TW)

( * ) Notice: Subject to any disclaimer, the term of this patent is extended or adjusted under 35 U.S.C. 154(b) by 162 days.

(21) Appl. No.: 11/924,692

(22) Filed: Oct. 26, 2007

(65) Prior Publication Data

US 2009/0110951 A1 Apr. 30, 2009

(51) Int. Cl.
*H01J 27/00* (2006.01)
*H01J 27/24* (2006.01)
*H01T 23/00* (2006.01)
*G01Q 70/10* (2010.01)
*G01Q 70/14* (2010.01)
*G01Q 70/16* (2010.01)

(52) U.S. Cl. .................. 250/423 R; 977/949; 977/950; 977/848; 977/900; 850/57; 850/59; 850/60

(58) Field of Classification Search .................. 850/29, 850/40, 60, 61; 216/83, 86, 100; 250/423 R, 250/423 F; 977/840, 848, 888, 895, 900, 977/949, 950
See application file for complete search history.

(56) References Cited

U.S. PATENT DOCUMENTS

| | | | | |
|---|---|---|---|---|
| 3,775,121 A | * | 11/1973 | Sharp | 430/311 |
| 5,630,932 A | * | 5/1997 | Lindsay et al. | 205/645 |
| 6,521,118 B1 | * | 2/2003 | Starosvetsky et al. | 205/655 |
| 7,032,437 B2 | * | 4/2006 | Lee et al. | 250/306 |
| 7,098,144 B2 | * | 8/2006 | Zhang et al. | 977/840 |
| 7,408,366 B2 | * | 8/2008 | Wang et al. | 324/754 |
| 7,585,474 B2 | * | 9/2009 | Wong et al. | 977/900 |
| 2006/0247758 A1 | * | 11/2006 | Krivoruchko | 623/1.15 |
| 2007/0033992 A1 | * | 2/2007 | Han et al. | 73/105 |
| 2007/0051900 A1 | * | 3/2007 | Ward | 250/423 R |
| 2009/0320991 A1 | * | 12/2009 | Boyle et al. | 977/888 |

OTHER PUBLICATIONS

Kalbitzer et al. ("High Brightness Source for Ion and Electron Beams," Rev. of Sci. Inst. vol. 60, No. 2, Feb. 1998, pp. 1026-1031.*
Nien ("Faceting Induced by ultrathin metal films: structure, electronic properties and reactivity," Surface Science 438 (1999) 191-206).*
Kounaves ("Iridium based Ultramicroelectrodes: Development and Use in Electrochemical analysis" Platinum Metals Rev. 1990, 34 (3) 131-134).*
Harris ("Chemical Etching of SiC" pp. 134-135, Properties of Silicon Carbide. EMIS datareviews series, No. 13, IET 1995).*

* cited by examiner

*Primary Examiner*—Jack I Berman
*Assistant Examiner*—Brooke Purinton
(74) *Attorney, Agent, or Firm*—Occhiuti Rohlicek & Tsao LLP

(57) ABSTRACT

A method for preparing an iridium tip with atomic sharpness. The method includes tapering an iridium wire to a needle shape and heating the iridium needle in an oxygen atmosphere. Also disclosed is an iridium needle having a pyramidal structure which terminates with a small number of atoms prepared by the methods.

25 Claims, 1 Drawing Sheet

ATOMICALLY SHARP IRIDIUM TIP

BACKGROUND

Fabrication of ultra-sharp (i.e., nanometer-sharp and atomically sharp) tips is among the most important prerequisites for producing coherent and bright particle beams (i.e., electron or ion beams) and obtaining valuable information from scanning beam/probe microscopes. The spot size of the particle beam, which depends on the sharpness of the tip, defines the lateral resolution of the microscope. Therefore, an ideal particle beam will be the one originated from a single-atom tip ("SAT") with minimum energy spread and opening angle.

Although tips with atomic sharpness (i.e., a tip formed of a single atom or less than 15 atoms) are highly desirable as they greatly improve the resolution of the microscope, they are difficult to prepare. Conventional methods for preparing single-atom tips in general require special equipments and complicated procedures. For example, a field ion microscope (FIM) or field emission microscope (FEM) is indispensable to monitor the tip in situ so that when the tip reaches its sharpest state (e.g., single-atom sharpness), one can stop the process to prevent the tip from turning blunt again. In addition, tips so prepared are usually not stable thus have short operation lifetimes. Tungsten is frequently used as a material for preparing the single-atom tips. However, at high fields, the tungsten tips will be corroded by chemically active ions such as $O_2^+$, $N_2^+$, $H_2O^+$, which greatly shorten their lifespan. Further, most of the ultra-sharp tips prepared by traditional methods cannot be regenerated.

These drawbacks hinder the ultra-sharp tips from commercial applications. They have so far only been used in the research laboratories. There is a need for stable, regenerable atomically sharp tips, especially single-atom tips and simple, reliable, low-cost methods for preparing them.

SUMMARY

This invention relates to a needle having an atomically sharp iridium tip, a method for preparing the tip, and its applications in field emission sources and scanning probe microscopy.

In one aspect, the invention features a method of making an atomically sharp iridium tip. The method includes tapering an end of an iridium rod; and heating the rod in a chamber, e.g., a vacuum chamber (i.e., a chamber having a total gas pressure of $10^{-4}$ Torr or less) that contains oxygen so that a pyramidal structure that has an atomically sharp iridium tip is formed on the tapered end.

Aspects can include one or more of the following features. The pyramidal structure has an iridium single-atom tip ("Ir-SAT"). The iridium rod is a single-crystalline <210> rod or a polycrystalline rod (i.e., a wire). The tapered end has a radius between 5 nm and 200 nm (e.g., 10 nm to 100 nm, 20 nm to 50 nm).

The chamber has an oxygen pressure between $10^{-8}$ and $10^{-5}$ Torr (e.g., between $10^{-7}$ and $10^{-6}$ Torr). Without wishing to be bound by the theory, the small amount of oxygen assists in the formation of atomically sharp iridium tip. The heating step is performed by a fast heating at a first temperature between 500 and 2000° C. (i.e., 1000° C., 1500° C.) for less than 10 seconds followed by a heating at a second temperature lower than the first temperature for 1 to 30 minutes. Without wishing to be bound by the theory, the fast heating step (i.e., less than 10 seconds) is performed to remove impurities or contaminants that are attached to the rod surface during the tapering process while the next heating step at a lower temperature (e.g., between 300° C. and 600° C.) is performed to anneal the iridium rod to form a pyramidal structure on the tapered end. Both steps can be carried out via a direct heating (i.e., via resistive effect) or via an indirect heating process (i.e., via an electron beam bombardment). Besides, the iridium surface also can be cleaned by a field evaporation method. For example, when a positive voltage in the range of 3 KV to 30 KV is applied to the tapered end of iridium wire, strong electric field of 5 V/nm to 50 V/nm can be formed near the apex of the tapered end. The field is capable of ionizing and evaporating the contaminants.

The tapering step is performed by electrochemical etching, mechanical grinding, or ion milling. In the electrochemical etching process, the iridium rod is placed in an electrolyte to taper its end with a voltage between 0.5 and 20 V (e.g., 1 to 15 V, or 2 to 10V) and a current between 1 mA and 1 A. The voltage or current can be supplied by a DC power supply or an AC power supply. The electrolyte can be a KCN aqueous solution (e.g., having a weight concentration of 10-30%) or a molten salt that is $NaNO_3$, $NaOH$, $KOH$, $KNO_3$, $KCl_3$, or a mixture thereof. The mechanical grinding includes the mechanical cutting, slurry polishing and other machining methods to abrade the iridium wire. The ion polishing includes using ion or other charged particle beams to bombard the iridium wire.

In another aspect, the invention features an iridium needle that includes a tapered end with a surface, and a pyramidal structure arranged on the surface. The pyramidal structure has a tip away from the surface and the tip is formed of a small number of iridium atoms.

Aspects can include one or more of the following features. The tip is formed of a single iridium atom. The iridium needle is formed of a single-crystalline <210> iridium rod or a polycrystalline rod. The surface is a {210} iridium crystal plane. The tapered end has a radius between 5 nm and 200 nm (e.g., 10 nm to 100 nm, or 20 nm to 50 nm).

Aspects can include one or more of the following advantages. The method for preparing iridium tip with atomic sharpness is simple, as it only involves straightforward procedures such as electrochemical etching an iridium rod, followed by a mild annealing in a chamber containing a small amount of oxygen. The method is also reliable, as pyramidal structure having a tip with atomic sharpness always forms and is regenerable on the tapered end of the iridium rod after annealing the rod in the presence of oxygen. Despite its atomic sharpness, the iridium tip of the pyramidal structure can sustain very high electric fields (e.g., up to about 53 V/nm). The tip is also quite stable and chemically inert. These unique properties make the Ir-SAT an ideal point source of electron and ion beams. The Ir-SAT can be used as a key component in most ion beam systems, such as focused ion beam (FIB), scanning ion microscope (SIM), secondary ion mass spectroscope (SIMS), ion implanter, ion beam lithography, reactive ion etching (RIE), and the like. The Ir-SAT is also a perfect point electron source, which can emit a bright and coherent electron beam. For instance, this Ir-SAT can be used in field emission electron microscope, electron holography, electron energy spectroscope, electron diffraction microscope, electron interferometry, E-beam lithography, low-energy electron microscope, and the like. In addition, the Ir-SAT itself can be an ideal scanning probe tip for scanning probe microscopes such as scanning tunneling microscope (STM).

Other features or advantages of the present invention will be apparent from the following drawing, detailed description of several embodiments, and also from the appending claims.

DETAILED DESCRIPTION

Figure 1:
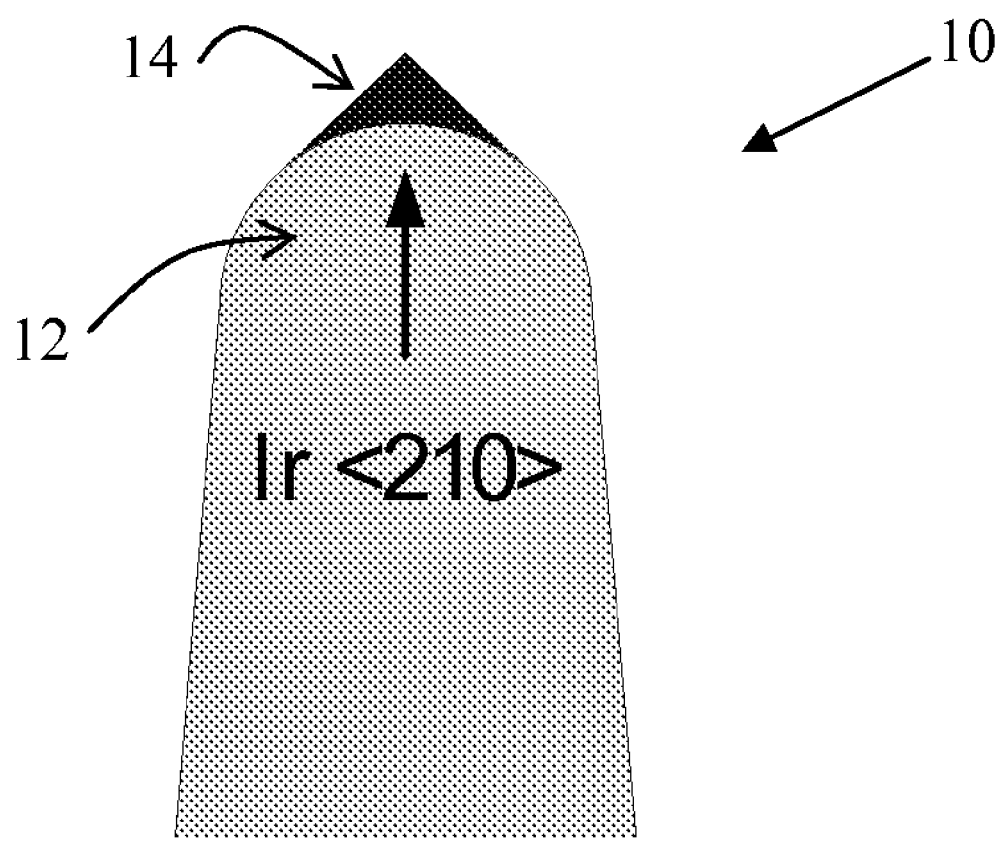
FIG. 1 is a schematic of the longitudinal cross section of an iridium needle.

This invention is based, at least in part, on the unexpected finding that an iridium tip with atomic sharpness (e.g., Ir-SAT) exhibits outstanding thermal and chemical stabilities, even under a very high electric field. Further, the tip can be regenerated for hundreds of times if it is accidentally or intentionally damaged.

Conventionally, sharp tips have been prepared by various polishing methods. For example, micrometer-sharp tip have been achieved by electrochemical polishing as described in U.S. Pat. No. 6,249,965. The tip is nearly hemi-spherical in shape (also called an equilibrium tip shape) with a radius around 0.05-50 µm. Another method uses field-assisted chemical etching in vacuum to trim the tip shank to form a nanometer-sharp tip, as described in M. Rezeq, J. Pitters, R. Wolkow, J. Chem. Phys., 124, 204716 (2006).

Atomically sharp tips have been prepared using special equipments and complicated procedures. For example, one uses ion back bombardment to generate a protrusion presumably terminated with one atom, as described in A. P. Janssen and J. P. Jones: J. Phys. D 4, 118 (1971) and H. W. Fink: IBM. J. Res. Dev. 30, 460 (1986). Other methods include using field-surface-melting to heat metal tips, combined with a field forming effect, as described in P. C. Bettler and F. M. Charbonnier: Phys. Rev. 119, 85 (1960) and V. T. Binh and N. Garcia: Ultramicroscopy 42-44, 80 (1992). Although the tips described above are good electron source and scanning probe tips, forming such atomically sharp tips is merely by chance thus not reliable. Further, the tips so prepared have short operation lifetimes and cannot be regenerated in situ.

The present document discloses, among others, a simple and reliable method for preparing robust atomically sharp Ir tips, more specifically, iridium tips with single atom sharpness.

In embodiments, an iridium wire is etched to form an iridium needle with a sharp end (i.e., tapered end). The surface of the iridium sharp end is then exposed to an oxygen atmosphere and annealed, which induces formation of an iridium tip with atomic sharpness on the surface of the sharp end. The iridium tip has only a very small number of atoms (i.e. less than 15), usually only one atom.

The iridium wire can be made of pure iridium (i.e., Ir content >90% by weight) or an iridium alloy. The wire can be polycrystalline or single crystalline. In one embodiment, a single-crystal <210> Ir wire is used. As illustrated in FIG. 1, after treating a tapered single-crystalline <210> iridium rod 10 by the present method, a well-defined nano-size pyramid 14 is spontaneously generated on top of the tapered end. The pinnacle of the nano-pyramid is self-aligned with the <210> direction of the iridium rod. The tapered end 12 of the iridium rod, in general, has a curved surface that is close to a hemi-spherical shape (or a wedge shape) with a radius (or radius of curvature) ranging from 5 nm to 1000 nm. In preferred embodiments, the radius is controlled to be smaller than 200 nm (e.g., 50-100 nm). The radius relates to the number and size of the pyramid generated on top of the tapered end. In some embodiments, there can be three other pyramids, each growing on one {210} plane and pointing 38 degrees (the dihedral angle of two {210} plane) away from the longitudinal axis. In still some embodiments, {210} planes can be exposed on the side surfaces of the iridium wire (e.g., polycrystalline or single crystalline Ir wire) after the tapering step, each of which can have one pyramid grown upon after the heating step.

The iridium wire can be tapered by mechanical polishing, electrochemical etching or ion milling to obtain a sharp end. In case of electrochemical etching, an electrolyte suitable for etching iridium, such as a molten salt mixture, is used. Examples of a suitable salt include but are not limited to $NaNO_3$, NaOH, KOH, $KNO_3$, and KCl.

After the etching step and before the annealing step, Ir surface can be cleaned either by repeatedly heating to 300-2000° C., or by applying a high positive electric field in a chamber. During cleaning, oxygen gas can be admitted into chamber to assist cleaning the surface. The oxygen partial pressure can be controlled in the range of $1\times10^{-8}\sim1\times10^{-5}$ Torr. Before admitting such low pressure of oxygen, the chamber must be evacuated until the background pressure (of residual gas) reaches well below that of the oxygen gas. Inert gases such as nitrogen or argon can be used to shorten the pumping time. In embodiments, a flashing temperature up to 1500° C. (e.g., duration <2 s) is applied to remove the contaminants (which are left behind after the etching process) from the Ir surface to reduce the likelihood of blunting the sharp end.

After cleaning, the iridium wire with its sharp end can be annealed to form tips with atomic sharpness. In general, the annealing temperature is lower than the flashing temperature. In one embodiment, the Ir wire is heated in a chamber containing oxygen at a temperature ranging from 300° C. to 600° C. Oxygen has a partial pressure in the range of $1\times10^{-8}\sim1\times10^{-5}$ Torr. In another embodiment, the tapered iridium wire can be exposed in oxygen atmosphere first, and then annealed in a chamber free of oxygen. The duration of the annealing process is not limited to a particular range as long as the aforementioned pyramidal structure forms on the surface of the tapered end. In general, it varies from 1 to 20 minutes. The temperature range can also be adjusted according to the actual application. Without wishing to be bound by the theory, it is believed that the formation of Ir tips with atomic sharpness is caused by oxygen adsorption on the Ir surface, as disclosed in Ermanoski et al., Surface Science, 549, 1 (2004) and Ermanoski et al., Surface Science, 596, 89 (2006). If tip (e.g., Ir-SAT) or pyramidal structure is destroyed, the tip or pyramid can be recovered by annealing the Ir wire in an oxygen atmosphere once again as described above.

As-prepared Ir tip of the pyramidal structure can sustain high electric fields. The tip is also quite stable and chemically inert. These unique properties make the Ir-SAT an outstanding gas field ion source (GFIS) with two major advantages. First, the resolution and brightness of the FIB systems can be improved significantly. For example, the smallest source size, i.e., the size of the Ir-SAT, is about two orders of magnitude smaller than that of liquid metal ion sources (LMISs). The opening angle (<1°) of the ion beam is at least one order of magnitude smaller than that of LMISs. Under a normal operating condition (i.e., ~$10^{-4}$ Torr of gas pressure), the beam emitted from a single atom has a brightness about 100 times higher than that of a divergent ion beam from a hemispherical micrometer-sharp tip. The ion energy spread is small as all gas molecules are ionized and accelerated at the same atomic point of the same electric field strength. Moreover, the total emission current is several orders of magnitude smaller than that of LMISs; thus, the effect of the Coulomb interaction is negligible. As a result, the ion beam emitted from the Ir-SAT can reach the same brightness and emission stability with much less chromatic aberration under a much lower emission current compared to that of LMISs. In sum, the Ir-SAT can generate an ion beam with the best resolution, high brightness and little aberration. Second, there is a wide selection of ions for different applications. Changing the background gas, ions of various chemical species can be emitted.

For the same reasons mentioned above, the Ir-SAT may also serve as an ideal field electron source or an ideal scanning probe tip. Besides, since the electron beams emitted from a single-atom tip are coherent, the beam can be used in electron holography or electron diffraction to obtain the three dimensional image of a sample.

In some embodiments, when multiple pyramids, each having an Ir-SAT, are formed on the curved surface of an Ir needle, a low enough extraction voltage is applied to the needle so that only one Ir-SAT is capable of emitting charged particles while the others cannot. As a result, a single point source can still be achieved.

The specific example below is to be construed as merely illustrative, and not limitative of the remainder of the disclosure in any way whatsoever. Without further elaboration, it is believed that one skilled in the art can, based on the description herein, utilize the present invention to its fullest extent. All publications recited herein are hereby incorporated by reference in their entirety.

Example

Etching

An Ir polycrystalline wire (the Ir wire had a diameter of 0.1 mm and a length of about 5 mm) was electrochemically etched to form a sharp end. The procedure is described below.

$NaNO_3$ and KOH by weight ratio of 1:1 were mixed in a platinum crucible and heated up to form a molten salt mixture. The iridium wire was dipped into the molten salt mixture with an AC voltage of 7-9 V (rms) applied between the wire and a counter electrode. The frequency was set from 60 to 300 Hz. After the etching, the Ir wire was rinsed in water and acetone. Measured via SEM, the etched Ir wire has a sharp end with a radius of about 200 nm).

Surface Cleaning

After the Ir wire was loaded in a chamber, it was heated at 500° C. and then at 1500° C. for 2 seconds or less each, in an oxygen atmosphere. The oxygen pressure was about $2 \times 10^{-7}$ Torr.

SAT Formation

At the same oxygen pressure as above ($P_{O2}=2 \times 10^{-7}$ Torr), the wire was annealed at 400-600° C. for 5 minutes.

Tip Characterization

The atomic structure of the Ir tip as well as the pyramid (i.e., the pyramidal structure) was characterized using an FIM. The FIM picture generated from the topmost layer of the pyramid, in which only one iridium atom was detected, confirmed the formation of an iridium single-atom tip after the aforementioned treatments. The topmost atom was then removed via field evaporation to expose the second layer. Three Ir atoms were detected from the second layer of the pyramid. The second layer was also removed by field evaporation. Three atomic ridges were detected, which confirmed that a three-sided pyramid was formed on the sharp end of the Ir wire. An atomic hardball model of the pyramid with a single-atom tip, which matches the FIM results nicely, further verifies the well-defined atomic structure of the pyramid.

The damaged pyramid can be recovered just by repeating the procedures described in the "SAT formation" step once again. The regenerated pyramid has the same atomic stacking structure. In addition, only one pyramid is formed on the sharp end of the Ir wire. Without wishing to be bound by the theory, it is believed that the area of {210} plane on the sharp end of the iridium wire is so small that only one nano-pyramid is generated. Multiple pyramids or planar truncated pyramid may be formed when the sharp end has a radius larger than 200 nm.

Application of Ir-SAT: Oxygen Ion Emission

In a chamber, an Ir-SAT was prepared as described above. Oxygen gas was admitted into the chamber until the pressure reached $5 \times 10^{-5}$ Torr. A positive high voltage was applied to the tip to field emit an oxygen ion beam of 3 pA. Only one bright oxygen ion beam was emitted from the single atom tip apex with a semi-extension angle~0.6 degree. The beam brightness reached $7 \times 10^{10}$ A/($m^2 \cdot Sr$), which was four orders of magnitude larger than that of oxygen plasma (brightness~$10^6$ A/($m^2 \cdot Sr$)), and was also higher than that of current gallium focused ion beam (brightness ~$10^9$ A/$m^2$/Sr). The emission current was stable through out the whole test. The Ir-SAT was used as gas field ion emitters for several different ion beams, including active $O_2^+$ ions, $H^+$, $He^+$, Ne+, and $Ar^+$ ions, for more than 150 hrs. No damage or degradation was observed. Consequently, the Ir-SAT is suitable to be used as a practical point ion source.

Without further elaboration, it is believed that one skilled in the art can, based on the above description, utilize the present invention to its fullest extent. The following specific embodiments are, therefore, to be construed as merely illustrative, and not limitative of the remainder of the disclosure in any way whatsoever. All publications cited herein are incorporated by reference.

Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features. From the above description, one skilled in the art can easily ascertain the essential characteristics of the present invention, and without departing from the spirit and scope thereof, can make various changes and modifications of the invention to adapt it to various usages and conditions. Thus, other embodiments are also within the scope of the following claims. For example, the method may also be applied to other metals such as platinum, palladium, and rhodium to generate atomically sharp tips.

What is claimed is:

1. A method of making an atomically sharp iridium tip, the method comprising:
   tapering an end of a single-crystalline <210> or polycrystalline iridium rod; and
   heating the rod in a chamber that contains oxygen so that a three-sided pyramidal structure is formed on the tapered end, wherein the pyramidal structure has an atomically sharp iridium tip.

2. The method of claim 1, wherein the iridium rod is a single-crystalline <210> rod.

3. The method of claim 2, wherein the heating step is performed by a fast heating at a first temperature between 500 and 2000° C. for less than 10 seconds followed by a heating at a second temperature lower than the first temperature for 1 to 15 minutes.

4. The method of claim 3, wherein the chamber has an oxygen pressure between $10^{-8}$ and $10^{-5}$ Torr.

5. The method of claim 4, wherein the pyramidal structure has a single-atom iridium tip.

6. The method of claim 5, wherein the tapering step is performed by electrochemical etching, mechanical grinding, or ion milling and the tapered end has a radius between 5 nm and 200 nm.

7. The method of claim 6, wherein the tapering step is performed by electrochemical etching the iridium rod in an electrolyte with a voltage between 0.5 and 20 V and a current between 1 mA and 1 A.

8. The method of claim 7, wherein the electrolyte is a KCN aqueous solution or a molten mixture of two or more salts selected from the group consisting of $NaNO_3$, NaOH, KOH, $KNO_3$, and $KCl_3$.

9. The method of claim 2, wherein the chamber has an oxygen pressure between $10^{-8}$ and $10^{-5}$ Torr.

10. The method of claim 9, wherein the pyramidal structure has a single-atom iridium tip.

11. The method of claim 1, wherein the heating step is performed by a fast heating at a first temperature between 500 and 2000° C. for less than 10 seconds followed by a heating at a second temperature lower than the first temperature for 1 to 10 minutes.

12. The method of claim 11, wherein the chamber has an oxygen pressure between $10^{-8}$ and $10^{-5}$ Torr.

13. The method of claim 12, wherein the pyramidal structure has a single-atom iridium tip.

14. The method of claim 1, wherein the iridium rod is polycrystalline.

15. An iridium needle comprising:
 a tapered end having a surface, the surface being a {210} iridium crystal plane, and
 a three-sided pyramidal structure arranged on the surface, wherein the pyramidal structure has a tip away from the surface and the tip is formed of a small number of iridium atoms.

16. The iridium needle of claim 15, wherein the iridium needle is formed of a single-crystalline <210> iridium rod.

17. The iridium needle of claim 16, wherein the tapered end has a radius between 5 nm and 200 nm.

18. The iridium needle of claim 16, wherein the tip is formed of a single iridium atom.

19. The iridium needle of claim 18, wherein the tapered end has a radius between 5 nm and 200 nm.

20. The iridium needle of claim 16, wherein the iridium needle contains only one said pyramidal structure.

21. The iridium needle of claim 15, wherein the tip is formed of a single iridium atom.

22. The iridium needle of claim 21, wherein the tapered end has a radius between 5 nm and 200 nm.

23. The iridium needle of claim 20, wherein the iridium needle contains only one said pyramidal structure.

24. The iridium needle of claim 15, wherein the tapered end has a radius between 5 nm and 200 nm.

25. The iridium needle of claim 24, wherein the iridium needle contains only one said pyramidal structure.

\* \* \* \* \*